United States Patent [19]

Ellsworth

[11] 4,301,516
[45] Nov. 17, 1981

[54] BUBBLE MEMORY STORAGE UNIT
[75] Inventor: William C. Ellsworth, Satellite Beach, Fla.
[73] Assignee: NCR Corporation, Dayton, Ohio
[21] Appl. No.: 102,682
[22] Filed: Dec. 12, 1979
[51] Int. Cl.³ ............................................. G11C 19/08
[52] U.S. Cl. ..................................... 365/15; 365/12; 365/200
[58] Field of Search ........................... 365/15, 12, 200
[56] References Cited
U.S. PATENT DOCUMENTS 4,027,283  5/1977  Tang ..................................... 365/15
4,090,251  5/1978  Flannigan et al. ..................... 365/15

Primary Examiner—James W. Moffitt
Attorney, Agent, or Firm—J. T. Cavender; Wilbert Hawk, Jr.; Richard W. Lavin

[57] ABSTRACT

A magnetic bubble domain memory device is provided that includes a magnetic domain data chip having a major-minor loop organization with on-chip firmware providing redundancy information enabling the use of the chip even though one or more defective minor loops may be present thereon. One of the pages is written in the minor loop, where a page is defined as a common bit position in each of the plurality of minor loops, with a series of magnetic domains having an odd total number. The next succeeding page in the minor loops contains a series of magnetic domains and voids which are representative of the loop numbers of defective minor loops on the chip with the remaining pages in the minor loops having an even number of magnetic domains contained in each of the pages. Collectively, the pages containing the odd and even number of magnetic domains together with the page containing the map of the defective minor loops comprise the on-chip firmware providing redundancy information. This magnetic domain structure is capable of screening out defective minor loops in the read and write operations, and enables synchronization of the magnetic domain device such that a selected page of data may be readily accessed from a plurality of minor loops when desired.

10 Claims, 2 Drawing Figures

BUBBLE MEMORY STORAGE UNIT

BACKGROUND OF THE INVENTION

The present invention is directed to a bubble memory constructed of a major loop-minor loop field access design having a number of defective minor loops and more particularly to a bubble memory chip having on-chip firmware providing redundancy information without seriously limiting the amount of useful data capable of being stored in the memory. Magnetic domain devices have been increasing in use due to demand for a high-speed large capacity memory device. These magnetic domain devices are generally planar in configuration and are constructed of material which has magnetically easy directions which are essentially perpendicular to the plane of the structure. Magnetic properties such as magnetization anisotropy, coercivity and mobility associated with magnetic domain devices allow such device to be maintained magnetically saturated with magnetism in a direction out of the plane and that small localized signal domain regions of magnetic polarization aligned opposite to the general polarization direction may be supported. Such localized regions which are generally cylindrical in configuration repressent binary memory bits. A magnetic domain can be manipulated by programming currents through a pattern of conductors positioned adjacent the magnetic material or by varying the surrounding magnetic field. Since the magnetic bubbles can be propagated, erased, replicated and manipulated to form data processing operations and their presence and absence detected, these bubbles may be utilized as memory devices.

Many circular organizations of operable magnetic domains have been disclosed in the prior art. One example is that of the major-minor loop memory organization disclosed in U.S. Pat. No. 3,618,054. The major-minor loop memory organization as well as its implementation and operation is well-known in the art. The major-minor loop organization includes a closed major loop which typically is established by an arrangement of T-bar permalloy circuits on, for example, an orthoferrite platelet. The magnetic domains are propagated around the loop by in-plane rotating magnetic field action. The major loop is generally elongated to permit a number of minor loops to be aligned alongside and perpendicular to it. Two-way transfer gates permit the transfer of magnetic domains from the minor loop to the major loop and from the major loop to a minor loop. Further access to the major loop is achieved by a detect and read connection thereto and by a separate write connection. This type of organization permits a synchronized domain pattern with propagation in the loops synchronous with the rotation of the in-plane field. That is, parallel transfer of data domains from a plurality of minor loops may be made simultaneously to the major loop. Moreover, a plurality of data chips, each with a major loop and a plurality of associated minor loops, may be treated together.

As is well-known in the art, all of the minor loops in the chip, upon command, transfer in parallel the bubble from their corresponding positions to the major loop. The bubbles are then serially detected as they are propagated passt the read position. New data may also be inserted at a write position for parallel transfer back into the minor loop at an appropriate later time, which in most cases occurs when the minor loop's magnetic domain propagation aligns the data for transfer.

Another structural organization of operable magnetic domains is the block replicate organization, also well-known in the art. The block replicate organization includes open-ended major propagation paths which may be established by an arrangement of T-bar permalloy circuits on, for example, a rare earth orthoferrite platelet. These major propagation paths are aligned adjacent to a plurality of minor loops. Data is written into the minor loops from a major propagation path by way of a swap transfer gate. Old data is transferred into the major propagation path by a swap signal received from a control chip as ultimately annihilated. A subsequent swap signal transfers new data into the minor loops where it becomes non-volatile. To read data out of the minor loops in a block replicate organization it is necessary to read out the magnetic domains onto separate major propagation paths. Replicate gates between the minor loops and the major propagation paths allow the stored data to remain within the minor loops with the data that is read out onto the major propagation path being a replicated version of stored data. The major distinction between a block replicate organization and a major-minor loop organization is that the data stored within the minor loops remain in the minor loops during the read operation mode in a block replicate, while the stored data is transferred completely out onto a major propagation path before replication to a user system in a major-minor loop organization. Also, since it is not physically possible to locate the minor loops so as to take advantage of all locations on the major propagation paths, the rate of bubble movement within the restrictive minor loops is greater than that possible at the detector. In order to overcome this physical disability, the major propagation paths in the block replicate organization and the output for the reading of the minor loops are merged, making one major propagation path shorter by one position as compared to another major propagation path allowing a merger of the two paths with one path complementing the void present in the other path. The result of the merger is to double the data rate out of the major loop to the detector making it equal to the rate within the minor loops.

In both the block replicate organization and the major-minor loop organization, unless special provision is made, every loop and every chip of the system must be perfect for the system to perform satisfactorily. Since chips contain entire groupings of registers, a defect in one of the minor loops would require discarding the entire chip. Various techniques have been proposed in the art for permitting the use of a magnetic domain chip even though one or more of its minor loops may be defective. Examples of such techniques may be found in U.S. Pat. Nos. 3,908,810 and 4,090,251. As disclosed in these patents, the technique used includes the use of a non-volatile semiconductor memory, such as a programmable read-only memory, to store data identifying the relative position of defective minor loops to each other or the storing of a redundancy loop pattern in the first page of the plurality of minor loops which takes the form of a series of magnetic domains with the presence of a magnetic domain designating only those loops that are capable of propagating magnetic domains. A page of information is defined to be the contents of a slice of one in the same bit position in all minor loops. A second redundancy pattern is stored in the second page of the plurality of minor loops in the form of loop numbers designating those minor loops that are capable of propagating magnetic domains while a third redundancy pattern stored in the third page of the plurality of minor loops in a form identical with that of the first page. Reading the redundancy patterns in the first three pages of the plurality of minor loops enables those minor loops which are defective to be found. The use of this type of structure is either costly or reduces the amount of storage area that is available for use by the processing system. Accordingly, it is an object of the present invention to provide an improved system of using major-minor magnetic domain organization to permit the use of data chips having one or more faulty minor loops. It is another object of this invention to provide an improved major-minor loop magnetic domain memory system which overcomes the problems stated above, while of low cost construction but retaining a high storage capacity.

SUMMARY OF THE INVENTION

According to the present invention, the magnetic domain memory architechture comprises a major loop, a plurality of minor loops, and transfer gates therebetween. The data stored in one of the pages of the minor loops will consist of a number of data bits, the total of which has an odd parity. A redundancy loop pattern is stored in the next succeeding page of the plurality of minor loops in the form of a series of magnetic domains where the presence of a magnetic domain designates only those loops that are capable of propagating magnetic domains while the lack of the presence of a magnetic domain designates those minor loops that are incapable of propagating magnetic domains. The remaining pages of the minor loops will have an even parity. In reading a page, the first available page of data in which an odd parity is detected, the system will be notified that the presence of a magnetic bubble domain within the next page at the specified bit position identifies a particular minor loop corresponding to that position as a good loop and conversely the absence of a magnetic bubble domain within the next page at the specified bit position identifies the particular minor loop corresponding to that position as a defective loop.

DESCRIPTION OF THE PREFERRED EMBODIMENT

Figure 1:
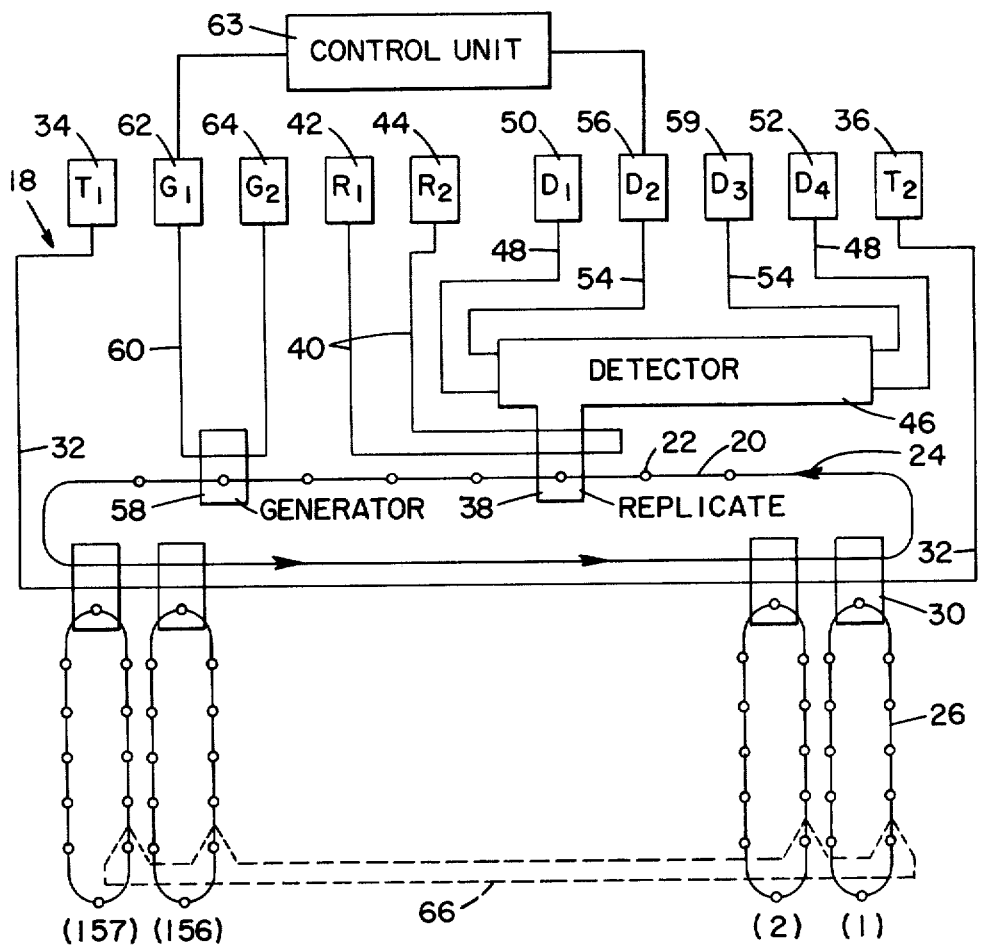
FIG. 1 is a schematic diagram of a bubble memory chip constructed according to the present invention.

Referring now to FIG. 1, there is shown a schematic diagram of the memory chip constructed in accordance with the present invention which comprises a major/minor loop magnetic domain memory configuration generally indicated by the numeral 18. This type of bubble memory is commercially available from the Texas Instruments Corporation of Dallas, Texas, as Part No. TIB0203. The major loop is illustrated by a single line 20 and the direction of propagation of the magnetic domains 22 within the loop is indicated by the arrow 24. In a line perpendicular to the major loop 20 are a plurality of identical minor loops 26. By way of illustration only, the number of minor loops 26 shown may comprise 157 minor loops. As is well-known in the art, the number and size of minor loops are dependent upon the chip capacity. Of the 157 minor loops 26 shown, a number of the minor loops are allowed to be defective. In the present example, the number of defective loops is 13, thus providing 144 minor loops for use as the memory 18. As will be described more fully hereinafter, the present invention enables the defective loops to be identified in a relatively simple manner.

As shown in FIG. 1, each of the minor loops 26 is coupled to the major loop 20 through transfer gates 30, each of which gates is connected to a transfer line 32. Upon the application of a transfer-out pulse over line 32 and through the circuit pins 34 and 36, the major loop 20 receives the magnetic domains 22 stored in the minor loops 26 which have been rotated to a position within each of the transfer gates 30. Once transferred to the major loop 20, each of the magnetic domains 22 will propagate to a point on the major loop where it is positioned within a replicate gate 38. If a destructive read is desired, the gate 38 is enabled by a pulse transmitted over line 40 between the pins 42 and 44, which deflects the magnetic domain into the detector 46 which in turn will first detect the presence and absence of a magnetic domain in response to signals transmitted over line 48 between pins 50 and 52, thereby translating such detection into electrical signals representing binary 1's and 0's which are sent to a control unit 63 coupled to a utilization device. After transfer to the control unit through pin 56, each of the magnetic domains 22 is annihilated. If it is necessary to restore the data in the minor loops 26, the amplitude and timing of the pulse transmitted over line 40 is adjusted to allow the replicate gate 38 to split each of the magnetic domains 22 into two parts, with one part continuing along the major loop 20 and the other part being deflected to the detector 46. As a result of this action, duplicate data bits or domains 22 will be present in both the detector 46 and the downstream section of the major loop 20.

If the write operation is to occur, the replicate gate 38 will deflect the magnetic domain into the detector 46 while a generator 58 positioned downstream of the replicate gate 38 will, in response to a current pulse transmitted over line 60 between the pins 62 and 64 under the control of signal generators by the control unit 63, create a magnetic domain 22 during a predetermined time period which constitutes a logic 1, while the absence of a magnetic domain 22 during the same time period will constitute a logic 0. In the present embodiment, 157 bits of data would be entered into the major loop 20 and shifted until the top data bit or domain 22 is aligned within the transfer gate 30 associated with the number (1) minor loop 26 as illustrated in FIG. 1. At this time, the transfer gate 30 associated with each of the minor loops 26 will be enabled by a current pulse transmitted over line 32 between the pins 34 and 36 resulting in a localized magnetic force being set up on the magnetic domains 22 to effect the parallel transfer of all of the magnetic domains in the major loop 20 to the top bit or domain position of the corresponding minor loop 26.

Magnetic domains 22 are located within the minor loops 26 at fixed storage locations or addresses comprising a page of data. As shown in FIG. 1, the page 66 refers to the magnetic domains and voids located at the identical address on each of the minor loops 26. As previously described, to read or write into a particular page, the desired page is rotated until it is positioned within the transfer gates 30 from which the page is transferred to the major loop from which the data is read or new data is written.

Figure 2:
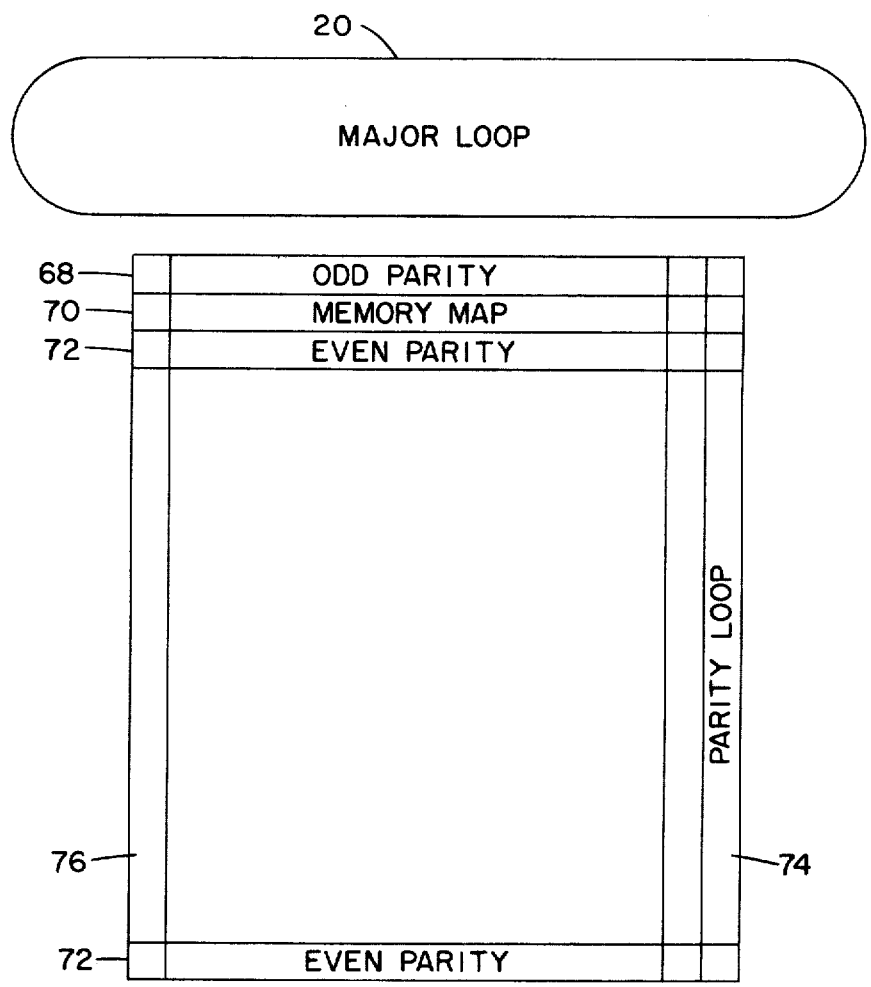
FIG. 2 is a block diagram of the major and minor loops of FIG. 1 showing the arrangement of the pages with respect to the major loop.

In order to locate a redundancy pattern stored in the minor loops for indicating which minor loops 26 are defective, one page 68 (FIG. 2) characterized as a header page is preformatted to have an odd parity, the next page 70 being written comprises a memory or redundancy map of the minor loops 26 using the presence of a magnetic domain 22 to indicate a good loop and the absence of a magnetic domain 22 to indicate a bad loop, and the remaining pages 72 are preformatted for having even parity. The magnetic domains in the first good loop 74 or the last good loop 76 of the minor loops could be used to indicate parity for all pages except the pages containing the redundancy pattern. Implicit in this arrangement is the use of the pages 68 and 70 as a reference index to locate the specific data stored within the minor loops 26. It will be seen from this construction that the header page 68 having an odd parity will locate the page 70 having the redundancy map indicating which pages are good and those which are bad.

In operation, the processing system in which the bubble memory 18 (FIG. 1) is incorporated will, during a power-up cycle, read out each of the pages (FIG. 1) by counting the number of magnetic domain positions in each page until identifying the header page 68 (FIG. 2) having an odd parity. The location of the header page 68 allows the system to synchronize a counter located in the control unit 63 (FIG. 1) for use in identifying the location of each of the pages 72 (FIG. 2) during subsequent read/write operations. Upon the positioning of the next page 70 containing the memory map in the major loop 20 (FIG. 2), the system will read out the map and store the redundancy data in an external memory such as a RAM unit located in the control unit 63. During subsequent read out of the pages 72 (FIG. 2) of data, each domain 22 position read out of the major loop 20 is compared with the redundancy map stored in the RAM unit for identifying those domain positions which are invalid as indicated by the absence of a magnetic domain in that position in the mask of the memory map. This sequence will also occur in the case where data is being written into a page location. It will thus be seen that this construction allows for the on-chip storage of the memory map at the loss of one minor loop 26 for parity and one page for the storage of the map, thus providing for a high capacity bubble memory unit.

Although only a certain preferred embodiment of the present invention has been described herein, it is not intended that the invention be restricted thereto, but that it is to be limited only by the true spirit and scope of the appended claims.

I claim:

1. A magnetic domain memory device comprising:
   a domain propagation structure including magnetic elements disposed in an arrangement on which magnetic domains propagate along a major path in response to a rotating magnetic field;
   a plurality of storage loops adjacent said major path in which one or more of the storage loops are defective;
   means for transferring said magnetic domains between said major path and said storage loops;
   and means for inhibiting the use of said defective storage loops including:
   a plurality of first pages of data disposed in a column bit position in each of said minor loops having a first predetermined number of magnetic domains, a second page of data disposed in a common bit position in each of said storage loops and comprising a series of magnetic domains and voids representing the location of said defective storage loops, and
   a third page of data disposed in a common bit position in each of said storage loops having a second predetermined number of magnetic domains different from said first predetermined number, said first and third pages of data comprise the data stored in said memory device.

2. The magnetic domain memory device of claim 1 in which said third page of data is located between one of said first pages of data and said second page of data.

3. The magnetic domain memory device of claim 1 in which said first predetermined number represents and even value.

4. The magnetic domain memory device of claim 3 in which said second predetermined number represents an odd value.

5. A magnetic domain memory device comprising:
   a domain propagation structure including magnetic elements disposed in an arrangement in which the magnetic domains propagate along a major loop in response to a rotating magnetic field;
   a plurality of minor loops located adjacent said major loop in which one or more of the minor loops are defective;
   means for transferring said magnetic domains between said major loop and said plurality of minor loops;
   means operably associated with said major loop for generating magnetic domains and introducing new data into major loop;
   means for detecting the presence of magnetic domains connected to an operably associated with said major loop;
   means operably associated with said major loop for splitting the said magnetic domains into two separate magnetic domains, one of which is transferred to said detecting means and the other of which is propagated in said major loop;
   means operably associated with said detecting means for destroying magnetic domains after detection;
   and means for inhibiting the use of said defective minor loops including;
   a plurality of first pages of data disposed in a common bit position in each of said minor loops having a first predetermined number of magnetic domains
   a second page of data disposed in a common bit position in each of said minor loops and comprising a series of magnetic domains and voids representing the location of said defective minor loops;
   and a third page of data disposed in a common bit position in each of said minor loops having a second predetermined number of magnetic domains different from said first predetermined number, wherein one of said minor loops includes magnetic domains and voids which allows said plurality of first pages and said third page of data to contain said first and second predetermined number of magnetic domains respectively.

6. The magnetic domain memory device of claim 5 in which said third page of data is located between one of said first pages of data and said second page of data.

7. The magnetic domain memory device of claim 5 in which said first predetermined number represents an even value.

8. The magnetic domain memory device of claim 7 in which said second predetermined number represents an odd value.

9. A method of accessing odd-chip redundancy date to insure data credibility for a magnetic domain memory device having a major propagation path operably aligned with a plurality of minor loops of which at least one is defective, wherein data stored in the minor loops on pages defined by corresponding common bit positions in each of said plurality of minor loops includes a first page having a first predetermined number of magnetic domains, a second page containing the redundancy data identifying the defective minor loops and a plurality of third pages each containing a second predetermined number of magnetic domains, said method comprising reading and evaluating each page for said first predetermined number of magnetic domains and storing the redundancy data located in the next succeeding page for use in evaluating the data stored in the minor loops in response to the finding of said first predetermined number of magnetic domains in one of the pages.

10. A method of synchronizing a magnetic domain memory device having redundancy data stored in one of a number of pages of a plurality of minor loops operably aligned with respect to a major loop, wherein each page of data is respectively defined by corresponding common bit positions in each of said plurality of minor loops, said memory device having a first page of data containing an odd number of magnetic domains, a second page of data located adjacent said first page of data and containing a series of magnetic domains and voids representative of the loop numbers of defective minor loops and remaining pages of data containing an even number of magnetic domains, siad method comprising:

reading and evaluating successive available pages of data from said plurality of minor loops until said odd number of magnetic domains is detected on a page;

reading the next available page of data;

storing the data read from said next available page;

evaluating the present page of data information with the data stored, and signalling synchronization of said magnetic domain device in response to the detection of the first page of data.

* * * * *